United States Patent
Sato

(10) Patent No.: US 6,885,222 B2
(45) Date of Patent: Apr. 26, 2005

(54) HIGH-SPEED CROSS-COUPLED SENSE AMPLIFIER

(75) Inventor: Yukio Sato, Saitama (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/464,539

(22) Filed: Jun. 19, 2003

(65) Prior Publication Data

US 2004/0155682 A1 Aug. 12, 2004

(30) Foreign Application Priority Data

Feb. 3, 2003 (JP) ........................................ 2003-026176

(51) Int. Cl.[7] .............................................. G01R 19/00
(52) U.S. Cl. ............................ 327/55; 327/57; 365/207
(58) Field of Search ...................... 327/52–57; 365/203, 365/205, 207

(56) References Cited

U.S. PATENT DOCUMENTS 5,377,150 A * 12/1994 McClure ..................... 365/207
5,982,690 A * 11/1999 Austin ........................ 365/205
6,359,473 B1 * 3/2002 You et al. ...................... 327/52

FOREIGN PATENT DOCUMENTS

JP         11-260064         9/1999

* cited by examiner

*Primary Examiner*—Long Nguyen
(74) *Attorney, Agent, or Firm*—Volentine Francos & Whitt, PLLC

(57) ABSTRACT

A sense amplifier has a pair of internal nodes that are precharged to a power-supply level. A first pair of n-channel transistors supplies current to the internal nodes responsive to a pair of data signals, both of which are initially high. When one of the data signals begins falling toward the low level, the corresponding n-channel transistor immediately reduces the current supplied to one of the internal nodes. A second pair of n-channel transistors, cross-coupled to the internal nodes, amplifies the resulting potential difference between the internal nodes, thereby pulling down the potential of one of the internal nodes. An output signal is generated from one or both of the internal nodes. The output signal is obtained quickly, because amplification begins without delay.

16 Claims, 3 Drawing Sheets

HIGH-SPEED CROSS-COUPLED SENSE AMPLIFIER

BACKGROUND OF THE INVENTION

1. Field of the Invention

The present invention relates to a sense amplifier for use in a semiconductor memory such as a static random access memory (SRAM).

2. Description of the Related Art

An SRAM memory cell outputs complementary data signals on a pair of data lines that have been precharged to equal potentials. The potentials on the data lines diverge slowly, because of limited driving capability of the transistors in the memory cell. It is known art to use a pair of complementary metal-oxide-semiconductor (MOS) inverters cross-coupled to the data lines as a sense amplifier to amplify the potential difference so that the data can be read quickly. This type of cross-coupled sense amplifier has the advantage of low power consumption, but the disadvantage of a comparatively slow amplification speed.

It is also known art to speed up the amplification process by having a pair of p-channel MOS transistors supply additional current to the inverters under control of the potentials on the data lines. In this scheme, however, the p-channel MOS transistors are initially switched off, and no additional current is supplied until the potential on one of the data lines falls far enough to switch on one of the p-channel MOS transistors. Amplification and data read-out are thus still delayed, adversely affecting the read access speed of the memory.

SUMMARY OF THE INVENTION

An object of the present invention is to provide a cross-coupled sense amplifier that can promptly amplify the potential difference on a pair of data lines.

In the invented sense amplifier, a pair of internal nodes are precharged to the power-supply level; then a first pair of n-channel MOS transistors is used to supply current to the internal nodes responsive to the potentials on the data lines. A second pair of n-channel MOS transistors, cross-coupled to the internal nodes, amplifies the potential difference between the internal nodes, thereby pulling down the potential of one of the internal nodes. A cross-coupled pair of p-channel MOS transistors may be used to pull up the potential of the other internal node. An output signal is generated from at least one of the two internal nodes.

The invented sense amplifier may use a latch to generate and hold the output signal. The latch may be controlled by a pair of p-channel MOS transistors switched on and off by the potentials of the internal nodes. Alternatively, the latch may be controlled by a pair of n-channel MOS transistors switched on and off by inverters connected to the internal nodes.

If the data lines are precharged to the power-supply level and then one of the data lines is driven toward a lower level, the first pair of n-channel MOS transistors reacts immediately to the potential difference between the data lines, and the second pair of NMOS transistors begins amplifying the potential difference immediately. The delays encountered in the prior art are thus avoided.

DETAILED DESCRIPTION OF THE INVENTION

Figure 1:
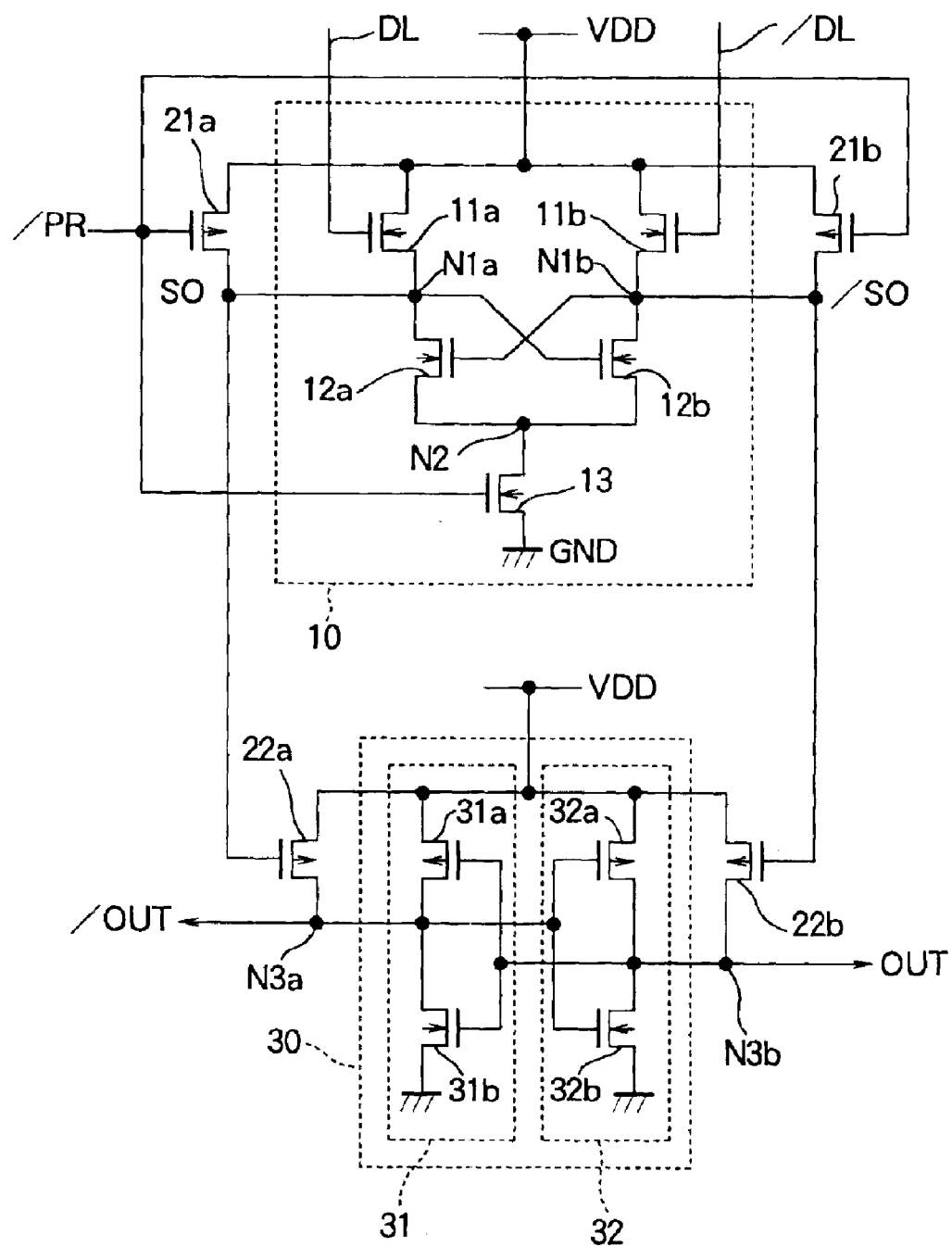
FIG. 1 is a circuit diagram of a sense amplifier illustrating a first embodiment of the invention.

Embodiments of the invention will be described with reference to the attached drawings, in which like elements are indicated by like reference characters. The embodiments are sense amplifiers useful in SRAM and other semiconductor memory devices.

In the following description, language such as 'A is connected to B through transistor C' means either that the source of transistor C is connected to A and the drain of transistor C is connected to B, or the source of transistor C is connected to B and the drain of transistor C is connected to A. Similarly, to say that transistor C is controlled by D means that the gate of transistor C is connected to or receives D.

Referring to FIG. 1, a first embodiment has an amplifier circuit 10 connected to a pair of data lines DL and /DL, the slash indicating that the signal on data line /DL is complementary to the signal on data line DL. The amplifier circuit 10 comprises n-channel MOS transistors (NMOS transistors) 11a, 11b, 12a, 12b, and 13. Data line DL is connected to the gate of NMOS transistor 11a; the complementary data line /DL is connected to the gate of NMOS transistor 11b. The drains of NMOS transistors 11a and 11b are connected to the power supply (VDD). The source of NMOS transistor 11a is connected to an internal node N1a from which the amplifier circuit 10 outputs an output signal SO; the source of NMOS transistor 11b is connected to an internal node N1b from which a complementary output signal /SO is output.

Internal node N1a is connected to an internal node N2 through NMOS transistor 12a; internal node N1b is connected to internal node N2 through NMOS transistor 12b. The gates of NMOS transistors 12a and 12b are cross-coupled to internal nodes N1b and N1a, respectively. Internal node N2 is connected to ground (GND) through NMOS transistor 13, the switching of which is controlled by an externally supplied control signal, more specifically a precharge signal /PR. Internal node N1a is connected to the power supply VDD through a p-channel MOS transistor (PMOS transistor) 21a; internal node N1b is connected to VDD through a PMOS transistor 21b. The precharge signal /PR also controls the switching of PMOS transistors 21a and 21b, which constitute a precharge circuit in the sense amplifier. The output signals SO and /SO control the switching of further PMOS transistors 22a and 22b, which constitute a data output circuit in the sense amplifier.

The first embodiment has a latch 30 from which an output data signal OUT and a complementary output data signal /OUT are output. The latch 30 comprises a cross-coupled pair of inverters 31 and 32. Inverter 31 comprises a PMOS transistor 31a and an NMOS transistor 31b; inverter 32 comprises a PMOS transistor 32a and an NMOS transistor 32b. The output terminal of inverter 31 (the drains of transistors 31a and 31b) and the input terminal of inverter 32 (the gates of transistors 32a and 32b) are connected to an output node N3a from which the /OUT data signal is obtained; the input terminal of inverter 31 (the gates of transistors 31a and 31b) and the output of inverter 32 (the drains of transistors 32a and 32b) are connected to an output node N3b from which the OUT data signal is obtained.

Output node N3a is connected to the drain of PMOS transistor 22a. The source of PMOS transistor 22a is connected to the power supply VDD, and the gate of PMOS transistor 22a is connected to internal node N1a. Output node N3b is connected to the drain of PMOS transistor 22b. The source of PMOS transistor 22b is connected to the power supply VDD, and the gate of PMOS transistor 22b is connected to internal node N1b. PMOS transistors 22a and 22b control data output by controlling the writing of data into the latch 30.

The operation of this sense amplifier will be described below.

Before data are read, a precharge operation is performed in which an external precharge circuit (not shown) precharges data lines DL and /DL to the power supply potential (VDD, also denoted High) and drives the precharge signal /PR to the ground level (GND, also denoted Low). NMOS transistor 13 is in the off-state, so no current flows through the amplifier circuit 10. The other NMOS transistors 11a, 11b, 12a, 12b in the amplifier circuit 10 are accordingly also in the off-state.

PMOS transistors 21a and 21b are in the on-state, so internal nodes N1a and N1b are precharged to the power supply potential VDD, and the signals SO and /SO output from internal nodes N1a and N1b both go High. PMOS transistors 22a and 22b are therefore in the off-state, and the output data held in the latch 30 remain unchanged.

At the end of the precharge operation, the precharge signal /PR goes High, switching NMOS transistor 13 on and PMOS transistors 21a and 21b off. Current begins to flow through the amplifier circuit 10, and the potential of internal nodes N1a and N1b begins to fall toward the operating point of the amplifier circuit.

Complementary signals are now output from a selected memory cell (not shown) on data lines DL and /DL, and the potential of one of the data lines begins to fall gradually toward ground. In the following description it will be assumed that the DL potential falls, while the /DL potential remains at the power supply level VDD. As soon as the DL potential begins to fall, the conductivity of NMOS transistor 11a is reduced, so less current flows through NMOS transistors 11a and 12a than through NMOS transistors 11b and 12b. The signal SO output from internal node N1a therefore becomes lower than the signal /SO output from internal node N1b. NMOS transistor 12b then becomes less conductive than NMOS transistor 12a, causing the /SO signal to return toward the High level while the SO signal continues to fall.

The rising /SO signal is fed back to the gate of NMOS transistor 12a, while the falling SO signal is fed back to the gate of NMOS transistor 12b. The effect of this feedback is to cause the SO signal to fall quickly to the Low level, switching PMOS transistor 22a on, thereby writing Low output data OUT and the High output data /OUT into the latch 30.

The precharge and data read-out operations are repeated as described above for a sequence of selected memory cells.

To summarize, the amplifier circuit 10 in the first embodiment comprises NMOS transistors 11a, 11b, 12a and 12b. When a complementary pair of signals are output on data lines DL and /DL, transistors 11a and 11b immediately sense the potential difference between the data lines and begin supplying different amounts of current to internal nodes N1a and N1b. Cross-coupled transistors 12a and 12b then operate by feedback to send the potential of one of these internal nodes quickly to the Low level while the potential of the other internal node returns toward the High level. This amplification operation begins without delay, enabling data read-out times to be reduced as compared with conventional cross-coupled sense amplifiers.

Figure 2:
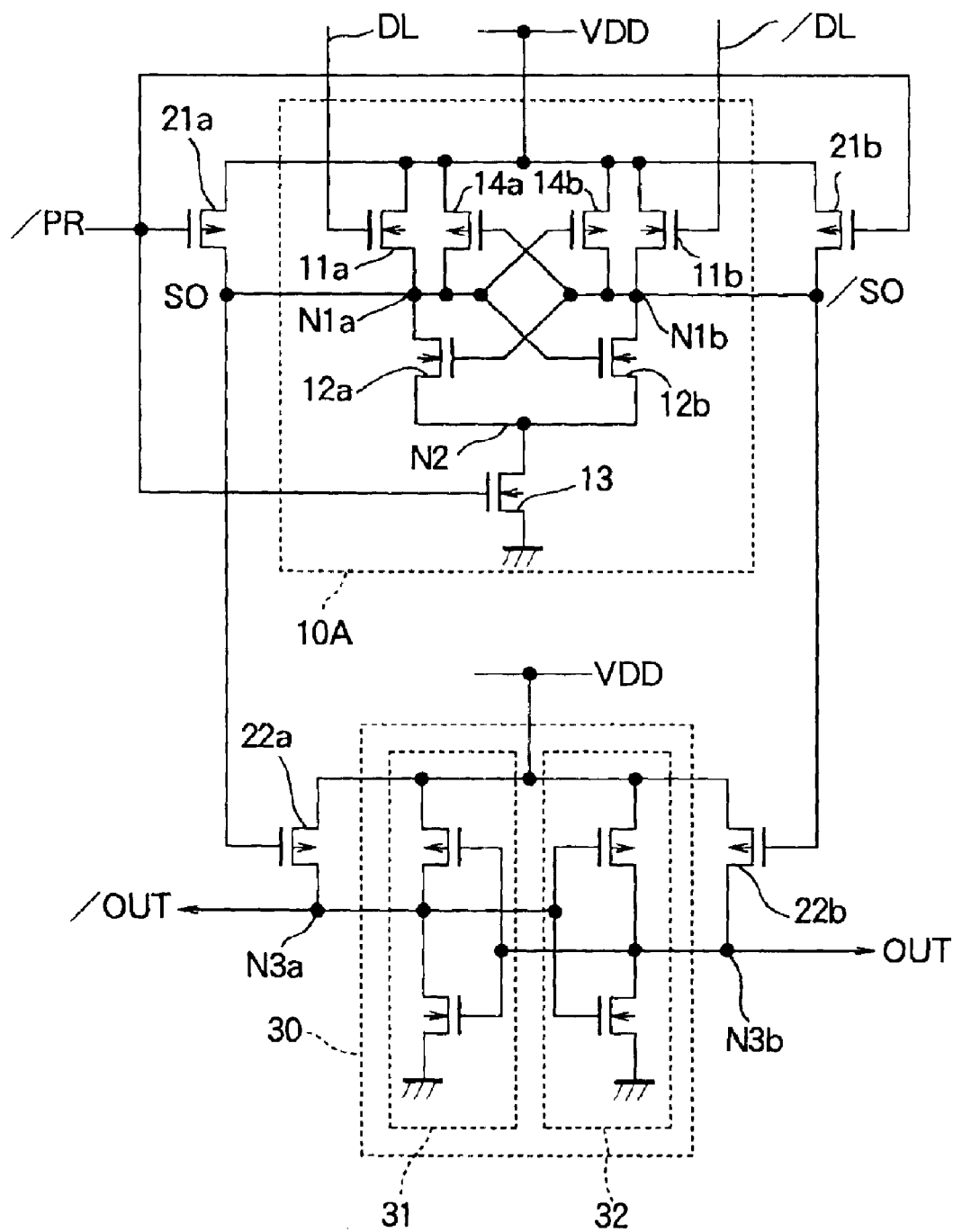
FIG. 2 is a circuit diagram of a sense amplifier illustrating a second embodiment of the invention.

Referring to FIG. 2, a second embodiment differs from the first embodiment by replacing the amplifier circuit 10 in FIG. 1 with an amplifier circuit 10A having additional PMOS transistors 14a and 14b. PMOS transistor 14a, the conductive state of which is controlled by the potential of internal node N1b, has its source connected to the power supply VDD and its drain connected to internal node N1a; PMOS transistor 14b, the conductive state of which is controlled by the potential of internal node N1a, has its source connected to the VDD and its drain connected to internal node N1b. The other transistors in FIG. 2 are similar to the corresponding transistors in FIG. 1.

The operation will be described below.

When data are read, complementary signals are output from a selected memory cell onto data lines DL and /DL, and the potential of one of the data lines begins to fall toward ground. It will again be assumed that the DL potential falls, so the SO signal output from internal node N1a falls faster than the /SO signal output from internal node N1b, NMOS transistor 12b becomes less conductive than NMOS transistor 12a, and the /SO signal returns toward the High level while the SO signal continues to fall toward the Low level. PMOS transistor 22a switches on, writing Low-level output data OUT and the High-level output data /OUT into the latch 30.

When the /SO signal rises to the point where the potential difference between node N1b and data line /DL is less than the threshold voltage of NMOS transistor 11b, transistor 11b switches off. In the meantime, however, the falling SO signal has switched on PMOS transistor 14b, so the /SO signal is quickly pulled up to the High level. PMOS transistors 14a and 22b accordingly switch off promptly, and the flow of current through these transistors 14a and 22b is quickly halted.

In the second embodiment, when one of the two internal nodes N1a and N1b in the amplifier circuit 10A goes Low, PMOS transistor 14a or 14b pulls the other internal node N1b or N1a up to the High level. Accordingly, no current flows through the corresponding PMOS transistor 22b or 22a to the latch 30 during the data read-out period. The second embodiment therefore reduces unnecessary power consumption as well as speeding up data read-out.

Figure 3:
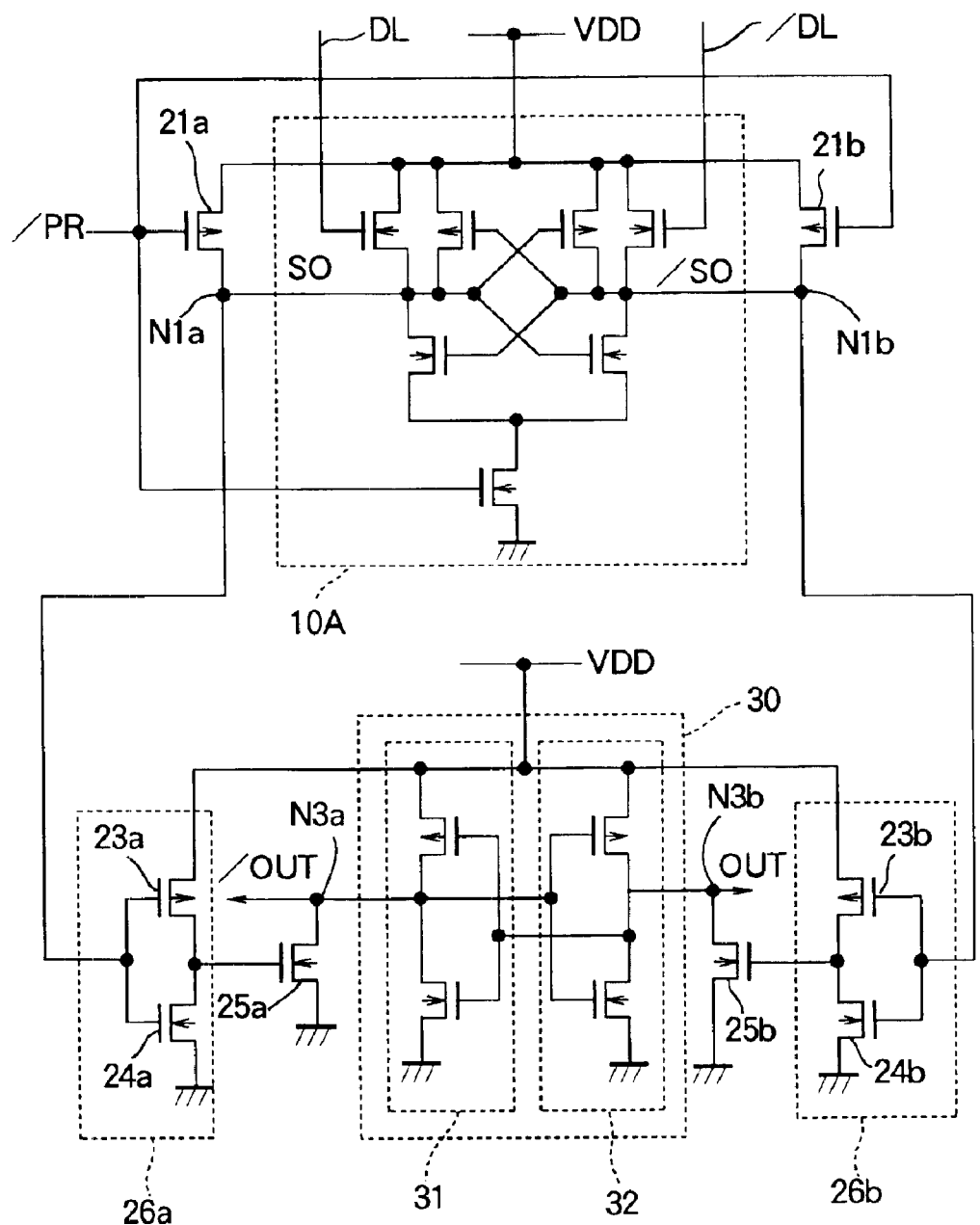
FIG. 3 is a circuit diagram of a sense amplifier illustrating a third embodiment of the invention.

Referring to FIG. 3, a third embodiment differs from the second embodiment by replacing PMOS transistors 22a and 22b in FIG. 2 with PMOS transistors 23a and 23b and NMOS transistors 24a, 24b, 25a, and 25b.

PMOS transistor 23a and NMOS transistor 24a constitute a first inverter 26a having an input terminal connected to internal node N1a and an output terminal connected to the gate of NMOS transistor 25a. The drain of NMOS transistor 25a is connected to output node N3a, and the source of NMOS transistor 25a is connected to ground. PMOS transistor 23b and NMOS transistor 24b constitute a second inverter 26b having an input terminal connected to internal node N1b and an output terminal connected to the gate of NMOS transistor 25b. The drain of NMOS transistor 25b is connected to output node N3b, and the source of NMOS transistor 25b is connected to ground.

The switching thresholds of these two inverters 26a, 26b are set lower than the operating-point potential of the amplifier circuit 10A, thus lower than the potential of internal nodes N1a and N1b immediately before data read-out begins. The inverted signals output by these inverters 26a, 26b are therefore Low in the period before data read-out begins. NMOS transistors 25a and 25b are accordingly in the off-state, and the data in the latch 30 remain unchanged.

When data read-out begins, the potential of one of the two internal nodes N1a and N1b falls to the Low level, and the inverted signal output by the corresponding inverter goes High, thereby writing data into the latch 30.

Since the first and second inverters 26a, 26b in the third embodiment keep NMOS transistors 25a and 25b switched off before data read-out begins, the third embodiment insures that the data in the latch 30 remain unchanged until data read-out begins, avoiding the output of false data before correct data are output.

The invention is not limited to the preceding embodiments. For example, the latch 30 is not limited to the structure described above, and the amplifier circuit 10A in FIG. 3 may be replaced with the amplifier circuit 10 in FIG. 1.

Those skilled in the art will recognize that further variations are possible within the scope of the invention, which is defined by the appended claims.

What is claimed is:

1. A sense amplifier connected to a power supply and ground, for amplifying data signals output on a pair of data lines during a data read-out operation, the sense amplifier comprising:

an amplifier circuit having a pair of internal nodes, a first pair of n-channel metal-oxide-semiconductor (MOS) transistors supplying current to the internal nodes responsive to potentials on the data lines, and a second pair of n-channel MOS transistors cross-coupled to the internal nodes to amplify a potential difference between the internal nodes;

a precharging circuit for connecting the internal nodes to the power supply before the data read-out operation and disconnecting the internal nodes from the power supply during the data read-out operation;

a data output circuit for generating an output signal responsive to a potential of at least one of the internal nodes; and a latch circuit for latching the output signal.

2. The sense amplifier of claim 1, wherein the sense amplifier is also coupled to a control signal line, the data lines include a first data line and a second data line, the internal nodes include a first internal node and a second internal node, and the amplifier circuit includes:

a first n-channel MOS transistor having a source coupled to the first internal node, a gate coupled to the first data line, and a drain coupled to the power supply;

a second n-channel MOS transistor having a source coupled to the second internal node, a gate coupled to the second data line, and a drain coupled to the power supply;

a third internal node;

a third n-channel MOS transistor having a source coupled to the third internal node, a gate coupled to the second internal node, and a drain coupled to the first internal node;

a fourth n-channel MOS transistor having a source coupled to the third internal node, a gate coupled to the first internal node, and a drain coupled to the second internal node; and a fifth n-channel MOS transistor having a source coupled to the ground, a gate coupled to the control signal line, and a drain coupled to the third internal node;

the first and second n-channel MOS transistors constituting said first pair of n-channel MOS transistors;

the third and fourth n-channel MOS transistors constituting said second pair of n-channel MOS transistors.

3. The sense amplifier of claim 2, wherein the control signal line receives a signal that switches the fifth n-channel MOS transistor off before the data read-out operation and on during the data read-out operation.

4. The sense amplifier of claim 2, the amplifier circuit further comprising:

a first p-channel MOS transistor having a source coupled to the power supply, a gate coupled to the second internal node, and a drain coupled to the first internal node; and a second p-channel MOS transistor having a source coupled to the power supply, a gate coupled to the first internal node, and a drain coupled to the second internal node.

5. The sense amplifier of claim 2, wherein the precharging circuit comprises:

a first p-channel MOS transistor having a source coupled to the power supply and a drain coupled to the first internal node; and a second p-channel MOS transistor having a source coupled to the power supply and a drain coupled to the second internal node.

6. The sense amplifier of claim 5, wherein the first and second p-channel MOS transistors have respective gates coupled to the control signal line.

7. The sense amplifier of claim 5, wherein the data output circuit comprises:

a first output node;

a second output node;

a third p-channel MOS transistor having a source coupled to the power supply, a gate coupled to the first internal node, and a drain coupled to the first output node; and a fourth p-channel MOS transistor having a source coupled to the power supply, a gate coupled to the second internal node, and a drain coupled to the second output node.

8. The sense amplifier of claim 7, wherein the latch circuit comprises a pair of inverters cross-coupled to the first and second output nodes.

9. The sense amplifier of claim 5, wherein the data output circuit comprises:

a first output node;

a second output node;

a first inverter having an input terminal coupled to the first internal node, and having an output terminal;

a second inverter having an input terminal coupled to the second internal node, and having an output terminal;

a sixth n-channel MOS transistor having a source coupled to the ground, a gate coupled to the output terminal of the first inverter and a drain coupled to the first output node; and a seventh n-channel MOS transistor having a source coupled to the ground, a gate coupled to the output terminal of the second inverter, and a drain coupled to the second output node.

10. The sense amplifier of claim 9, wherein the first inverter and the second inverter have switching thresholds lower than potentials reached by the first and second internal nodes before the data read-out operation begins.

11. The sense amplifier of claim 9, wherein the latch circuit comprises a pair of inverters cross-coupled to the first and second output nodes.

12. A method of sensing complementary data signals output on a pair of data lines, comprising:

precharging a pair of internal nodes to a power-supply level;

using a first pair of n-channel metal-oxide-semiconductor (MOS)transistors to supply current to the internal nodes responsive to potentials on the data lines;

using a second pair of n-channel MOS transistors, cross-coupled to the internal nodes, to amplify a potential difference between the internal nodes, thereby pulling down a potential of one of the internal nodes;

generating an output signal from at least one of the internal nodes; and using a cross-coupled pair of p-channel MOS transistors to pull up a potential of another one of the internal nodes.

13. The method of claim 12, wherein said generating an output signal comprises latching the output signal.

14. The method of claim 13, wherein said latching the output signal comprises:

using the potentials of the internal nodes to control a pair of p-channel MOS transistors; and using the pair of p-channel MOS transistors to control a latch.

15. The method of claim 13, wherein said latching the output signal comprises:

inverting the potentials of the internal nodes;

using the inverted potentials of the internal nodes to control a third pair of n-channel MOS transistors; and using the third pair of n-channel MOS transistors to control a latch.

16. The method of claim 15, wherein said inverting the potentials of the internal nodes comprises supplying the potentials of the internal nodes to respective inverters having a switching threshold lower than the potential reached by either of the internal nodes before amplification of the potential difference between the internal nodes.

* * * * *